United States Patent
Wacyk

(10) Patent No.: US 9,984,616 B2
(45) Date of Patent: May 29, 2018

(54) SYSTEM AND METHOD FOR ELECTRICALLY REPAIRING STUCK-ON PIXEL DEFECTS

(71) Applicant: eMagin Corporation, Hopewell Junction, NY (US)

(72) Inventor: Ihor Wacyk, Hopewell Junction, NY (US)

(73) Assignee: eMagin Corporation, Hopewell Junction, NY (US)

( * ) Notice: Subject to any disclaimer, the term of this patent is extended or adjusted under 35 U.S.C. 154(b) by 386 days.

(21) Appl. No.: 14/604,250

(22) Filed: Jan. 23, 2015

(65) Prior Publication Data

US 2015/0213756 A1 Jul. 30, 2015

Related U.S. Application Data

(60) Provisional application No. 61/932,022, filed on Jan. 27, 2014.

(51) Int. Cl.
| | |
|---|---|
| *G09G 3/3225* | (2016.01) |
| *G09G 3/00* | (2006.01) |
| *G11C 17/16* | (2006.01) |

(52) U.S. Cl.
CPC .......... *G09G 3/3225* (2013.01); *G09G 3/006* (2013.01); *G09G 2300/0413* (2013.01); *G09G 2330/08* (2013.01); *G09G 2330/10* (2013.01); *G11C 17/16* (2013.01); *H01L 2251/568* (2013.01); *H01L 2924/0002* (2013.01)

(58) Field of Classification Search
CPC .. G09G 3/3225; G09G 3/006; G09G 2330/08; G11C 17/16; H01L 2251/568
See application file for complete search history.

(56) References Cited

U.S. PATENT DOCUMENTS

| | | | |
|---|---|---|---|
| 6,332,016 B1 | 12/2001 | Kobayashi | |
| 7,292,024 B2 | 11/2007 | Zhang | |
| 7,688,446 B2 | 3/2010 | Nabatova-Gabain et al. | |
| 2006/0061248 A1 | 3/2006 | Cok et al. | |
| 2006/0164407 A1 | 7/2006 | Cok et al. | |
| 2007/0236440 A1* | 10/2007 | Wacyk ................. | G09G 3/3233 345/92 |
| 2008/0085652 A1 | 4/2008 | Winters | |
| 2009/0061720 A1 | 3/2009 | Fujimaki | |
| 2010/0233931 A1 | 9/2010 | Yamagata et al. | |

FOREIGN PATENT DOCUMENTS

JP 2011164219 A * 8/2011

OTHER PUBLICATIONS

Machine translation of JP 2011164219 A.*

* cited by examiner

*Primary Examiner* — Michael Pervan
(74) *Attorney, Agent, or Firm* — Kaplan Breyer Schwarz, LLP

(57) ABSTRACT

A system and method for repairing an OLED display having an array of OLED pixels including at least one inoperative OLED pixel, wherein each OLED pixel is controlled by a pixel driver circuit having a fusible element. The system includes a first switch for reducing an energizing signal to the OLED pixel array, the energizing signal exceeding a threshold level below which the OLED pixels should not emit light. A second switch is provided for increasing a bias signal to the OLED pixel array, the bias signal exceeding a threshold level above which the fusible element of the inoperative OLED pixels are blown, such that inoperative OLED pixels no longer emit light.

14 Claims, 4 Drawing Sheets

SYSTEM AND METHOD FOR ELECTRICALLY REPAIRING STUCK-ON PIXEL DEFECTS

CROSS-REFERENCE TO RELATED APPLICATION

This application claims the benefit of provisional patent application Ser. No. 61/932,022 filed in the United States Patent and Trademark Office on Jan. 27, 2014, which is incorporated in its entirety by reference herein.

STATEMENT REGARDING FEDERALLY SPONSORED RESEARCH OR DEVELOPMENT

Not applicable

BACKGROUND OF THE INVENTION

Field of the Invention

This invention relates generally to active-matrix organic light-emitting diode ("AMOLED") display devices and more particularly to a system and method for electrically repairing defective OLED pixels within an OLED display device.

Description of Prior Art

An OLED display device typically includes a stack of thin layers formed on a substrate. In the stack, a light-emitting layer of a luminescent organic solid, as well as adjacent semiconductor layers, is sandwiched between a cathode and an anode. The light-emitting layer may be selected from any of a multitude of fluorescent organic solids. Any of the layers, and particularly the light-emitting layer, may consist of multiple sub layers.

In a typical OLED, either the cathode or the anode is transparent. The films may be formed by evaporation, spin coating, other appropriate polymer film-forming techniques, or chemical self-assembly. Thicknesses typically range from a few monolayers to about 1 to 2,000 angstroms. Protection of OLED against oxygen and moisture can be achieved by encapsulation of the device. The encapsulation can be obtained by means of a single thin-film layer situated on the substrate, surrounding the OLED.

High resolution active matrix displays may include millions of pixels and sub-pixels that are individually addressed by the drive electronics. Each sub-pixel can have several semiconductor transistors and other IC components. Each OLED may correspond to a pixel or a sub-pixel, and these terms are used interchangeably herein.

OLED pixels have a threshold energizing signal at which point they turn on, and begin to emit light. As the energizing signal falls below the threshold level, a correctly operating OLED ceases to emit light. During the manufacture of an OLED device including an array of OLED pixels, disturbances or contamination may cause one or more OLED pixels to not operate properly. Due to processing issues or contamination, a few sub-pixels can remain on irrespective of the driving conditions. In particular, some OLED pixels may continue to emit light after the energizing signal has fallen below the threshold level. These defective sub-pixels, also called inoperative OLED pixels, may also be called stuck-on pixels or stuck-on OLED pixels.

In many applications the stuck-on sub-pixels are very undesirable, which may result in a zero tolerance for stuck-on sub-pixels. Out of millions of sub-pixels in a display it is typically very difficult to obtain a display with zero stuck-on pixels or sub-pixels. One or more stuck-on OLED pixels may compromise an entire array of OLED pixels, and conventionally may require that the entire array to be discarded.

Laser zapping is one technique for repairing a display having a small number of defects. In laser zapping, the entire display is scanned for defects and then the defects are repaired one-by-one. This technique is time consuming and costly since the defects have to be found first and then repaired one at a time.

It is, therefore, a primary object of the present invention to provide a system and method that electrically repairs a plurality of stuck-on pixel defects within a display.

It is another object of the present invention to provide a process for simultaneously repairing multiple stuck-on pixel defects within a display using one parallel electrical operation.

It is another object of the present invention to provide a process for repairing stuck-on pixel defects within a display without an expensive microscope or laser positioning system.

It is another object of the present invention to provide a process for repairing stuck-on pixel defects within a display without a camera and optical acquisition system for locating the defective pixels.

BRIEF SUMMARY OF THE INVENTION

In accordance with one aspect of the present invention, a driver circuit for an OLED pixel is provided wherein the pixel has an operative and an inoperative state. The driver circuit includes a first switching device for applying a drive current to the OLED pixel for modulating luminance. The drive current to the OLED pixel is reduced below a threshold level below which the OLED pixel should not emit light. The driver circuit includes a second switching device for applying a bias signal to the driver circuit. The driver circuit includes means for interrupting current applied between the first and second switching devices when the OLED pixel is in the inoperative state.

The means for interrupting current may be a fusible element. The drive current may be reduced to the OLED pixel below a threshold level below which the first switching device is turned off and the operative OLED pixel will not emit light and as such, no current will flow through the fusible element.

The drive current to the OLED pixel may be reduced below the threshold level below which the first switching device remains stuck-on and the inoperative OLED pixel emits light. In which case, the bias signal applied to the inoperative OLED pixel exceeds the threshold level above which the fusible element is blown. The fusible element may blow open at a current level of 10 mA or greater. The fusible element may comprise low-resistance polysilicon. The fusible element may comprise metal.

The means for interrupting current may be an electrically programmable switch.

In accordance with an additional embodiment, a method for manufacturing an organic light emitting diode (OLED) array comprising OLED pixels is provided. The method includes at least one stuck-on OLED pixel, comprising at least partially forming the OLED array, each OLED pixel in the OLED array including a fusible element and being responsive to an energizing signal exceeding a threshold level to energize same. The method further includes applying the energizing signal to at least one of the OLED pixels, the energizing signal exceeding the threshold level. The method further includes reducing the energizing signal applied to the at least one of the OLED pixels below the threshold level, wherein the at least one stuck-on OLED pixel continues to remain energized after the energizing signal is reduced below the threshold level. The method further includes increasing a bias signal to the OLED array, the bias signal exceeding the threshold level above which the fusible element of the at least one stuck-on OLED pixel is blown and the at least one stuck-on OLED pixel no longer emits light.

In accordance with an additional embodiment, a method for repairing stuck-on OLED pixels within an OLED array manufacturing process is provided. The OLED array comprises at least one operative OLED pixel and at least one inoperative OLED pixel, wherein each OLED pixel is controlled by a driver circuit having a fusible element. The steps of the method comprise applying an energizing signal to the OLED array, the energizing signal exceeding a threshold level to energize same. The steps further comprise driving at least one operative OLED pixel within the OLED array to black by reducing the energizing signal to the OLED array below the threshold level, and blowing the fusible element of the at least one inoperative OLED pixel by increasing a bias signal to the OLED array above the threshold level. The bias signal may be increased to at least 5 volts.

In accordance with an additional embodiment, a system for repairing stuck-on OLED pixels in an OLED array manufacturing process is provided. The OLED array comprises OLED pixels including at least one stuck-on OLED pixel, wherein each OLED pixel is controlled by a driver circuit having a fusible element. The system includes means for applying an energizing signal to the OLED array, wherein the energizing signal exceeding a threshold level below which the OLED pixels should not emit light. The system further includes means for reducing the energizing signal applied to the OLED array below the threshold level, wherein the at least one stuck-on OLED pixel continues to remain energized after the energizing signal is reduced below the threshold level. The system further includes means for increasing a bias signal to the OLED array, the bias signal exceeding the threshold level above which the fusible element of the at least one stuck-on OLED pixel is blown, such that the at least one stuck-on OLED pixel no longer emits light.

In accordance with an additional embodiment, a computer-readable medium having stored thereon computer-executable instructions is provided. The computer-executable instructions causing a processor to perform a method when executed, the method for repairing stuck-on OLED pixels within an OLED array manufacturing process, the OLED array comprising at least one operative OLED pixel and at least one inoperative OLED pixel, wherein each OLED pixel is controlled by a driver circuit having a fusible element. The method comprises applying an energizing signal to the OLED array, the energizing signal exceeding a threshold level to energize same. The method further comprising driving at least one operative OLED pixel within the OLED array to black by reducing the energizing signal to the OLED array below the threshold level. The method further comprises blowing the fusible element of the at least one inoperative OLED pixel by increasing a bias signal to the OLED array above the threshold level.

In accordance with an additional embodiment, a method for repairing stuck-on OLED pixels within an OLED array manufacturing process is provided. The OLED array comprises at least one operative OLED pixel and at least one inoperative OLED pixel, wherein each OLED pixel is controlled by a driver circuit having an electrically programmable switch. The steps of the method comprise programming the electrically programmable switch to a high threshold state for at least one inoperative OLED pixel and driving the at least one operative OLED pixel to black by reducing an energizing signal to the OLED pixel array.

BRIEF DESCRIPTION OF THE SEVERAL VIEWS OF THE DRAWINGS

To these and to such other objects that may hereinafter appear, the present invention relates to a system and method for electrically repairing a display having stuck-on pixel defects as described in detail in the following specification and recited in the annexed claims, taken together with the accompanying drawings, in which like numerals refer to like parts in which:

To the accomplishment of the above and related objects the invention may be embodied in the form illustrated in the accompanying drawings. Attention is called to the fact, however, that the drawings are illustrative only. Variations are contemplated as being part of the invention, limited only by the scope of the claims.

DETAILED DESCRIPTION OF THE INVENTION

The present invention is directed to a system and method for electrically repairing an OLED display having an array of OLED pixels, including at least one defective pixel (or pixel, also referred to as a stuck-on OLED pixel).

Figure 1:
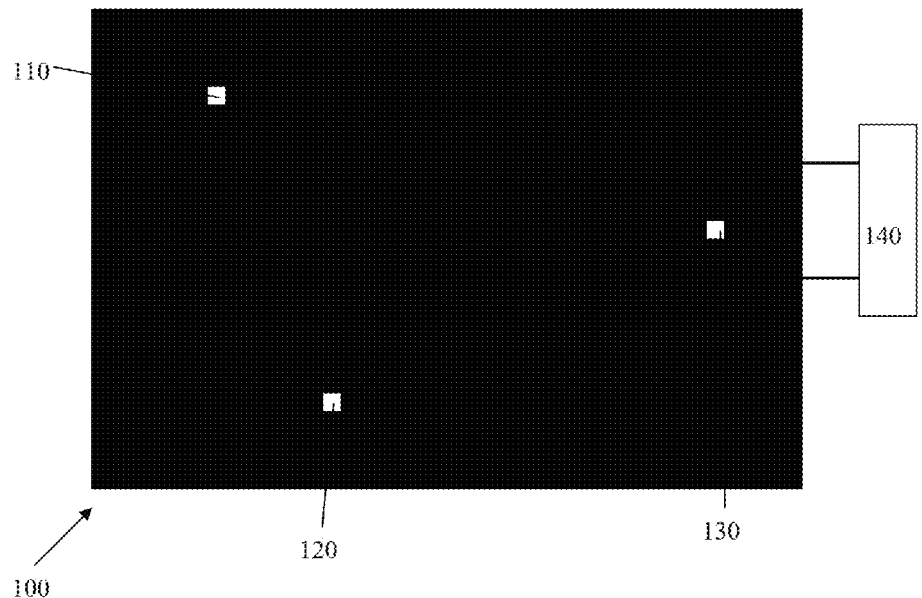
FIG. 1 is a plan view of an OLED array and a testing device during a testing procedure in accordance with an exemplary embodiment.

FIG. 1 is a plan view of a partially formed OLED array 100, comprising a plurality of OLED pixels 105, connected to a driver circuit 140 for purposes of testing and eliminating stuck-on OLED pixels. During testing, the driver circuit 140 is connected to the anode and cathode circuits of the OLED array 100 in order to drive each OLED above an energizing threshold, at which time the OLED becomes illuminated. The energizing signal may be applied to all of the OLED pixels 105 within the OLED array 100, or fewer than all of the OLED pixels in a partially formed OLED array 100. Subsequently, the driver circuit 140 is operated to reduce the voltage on the anode and cathodes to below the threshold voltage level.

The threshold level as discussed herein is also referred to as a D.C. voltage, above which an OLED pixel emits light responsive to an additional A.C. voltage. The variability of the additional A.C. voltage provides a variable intensity output for the OLED pixel. The OLED pixel may have 256 intensity levels within the additional A.C. voltage, with 1 being the lowest intensity and 256 being a maximum intensity. In this case the D.C. voltage corresponds to a black output characterized as a zero level. The threshold level discussed above would in this case correspond to level 1, below which the OLED pixel output should be black.

FIG. 1 illustrates the OLED array 100 being driven by the driver circuit 140 at a level below the threshold voltage level after being driven above the threshold voltage level. As shown, the OLED array 100 includes three stuck-on OLED pixels 110, 120 and 130. Each of the stuck-on OLED pixels 110, 120 and 130 continues to be illuminated even though the driver circuit 140 drives the OLED array 100 at a level below the threshold voltage level. The driver circuit 140 may be operated at a level below the threshold voltage level but 1) above 90% of the threshold voltage level, 2) above 75% of the threshold voltage level, 3) above 50% of the threshold voltage level, or 4) above any appropriate percentage of the threshold voltage level. Alternatively, the driver circuit 140 may operate as a current source to thereby energize the OLED pixels, and to subsequently reduce the current to below a threshold energizing level.

Figure 2:
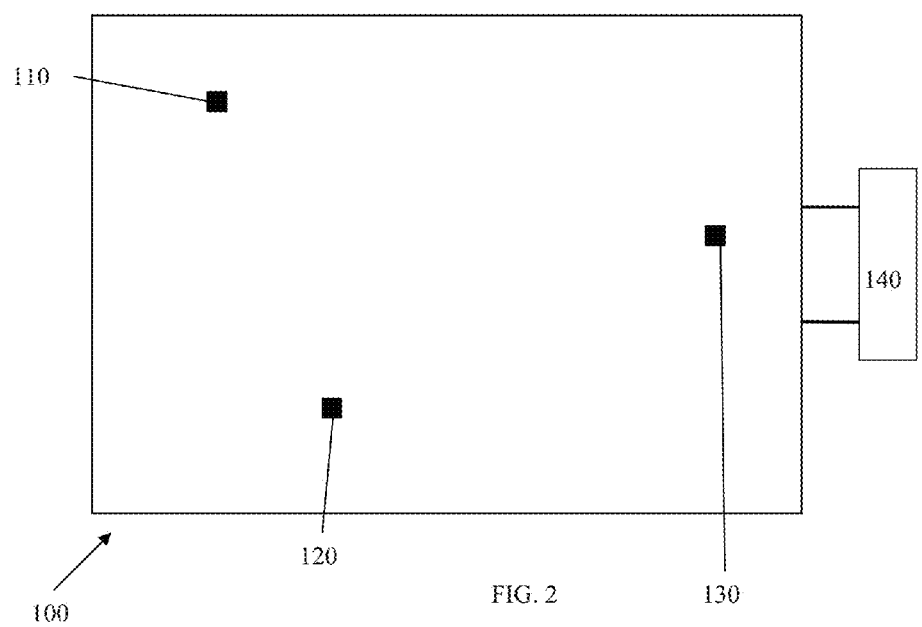
FIG. 2 is a plan view of the OLED array and the testing device of FIG. 1 after performance of a method in accordance with an exemplary embodiment.

FIG. 2 is a plan view of the OLED array 100 after performance of an operation to eliminate stuck-on OLED pixels. Interrupting current applied to the stuck-on OLED pixels 110, 120 and 130 to drive the OLED pixels to black and become inoperative. Therefore, application of a voltage or current above a threshold level by driver circuit 140 causes all of the OLED pixels 105 in OLED array 100 to illuminate, except stuck-on OLED pixels 110, 120 and 130. Therefore, each of stuck-on OLED pixels 110, 120 and 130 remains dark in FIG. 2, while the remainder of the OLED array 100 is illuminated. Though this may reduce the overall brightness of the OLED array 100, the driver circuit 140, or any other driver circuit connected to the OLED array 100 during testing or operation, may be configured to compensate for the loss of brightness due to the elimination of the stuck-on OLED pixels 110, 120 and 130.

Figure 3:
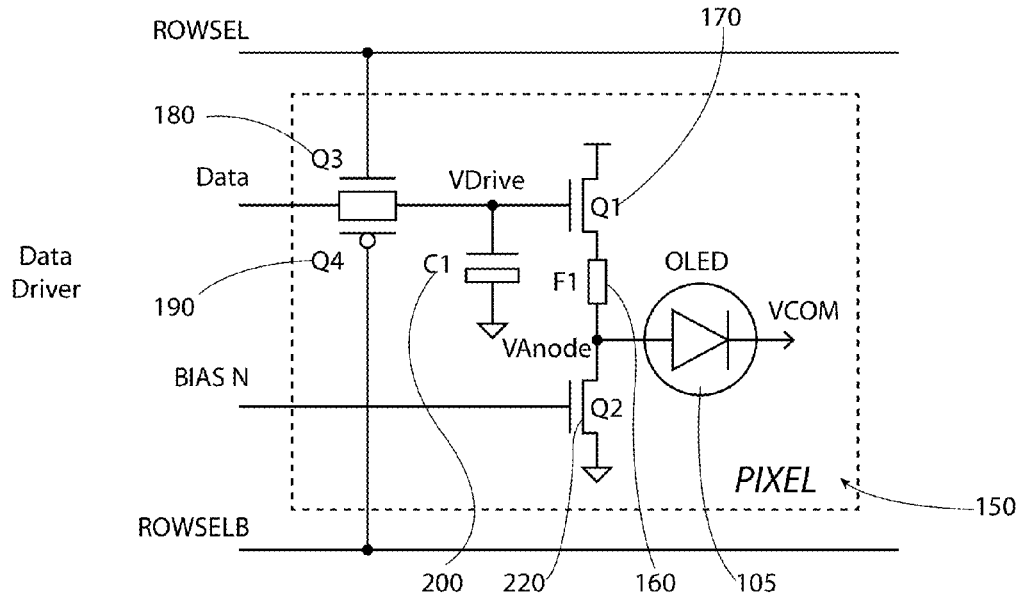
FIG. 3 is a pixel circuit of the present invention showing a fusible element applied to a pixel driver circuit in accordance with an exemplary embodiment.

FIG. 3 illustrates a pixel circuit 150, including driver circuit 140 and means for interrupting current 160 associated with each OLED pixel. Preferably, the means for interrupting current 160 is a low-current fusible element. The fusible element 160 can be made of metal or polysilicon formed in the integrated circuit (IC) process. The driver circuit 140 includes a first switch 170 for controlling the drive current or energizing signal that modulates luminance of the OLED pixel 105. A second switch 220 provides a small bias current (~1 nanoamp) to linearize the response of the first switch 170 when the OLED pixel 105 is conducting or in the lit state. The small bias current is used during normal OLED operation. The high bias current is used during the repair phase. A third and fourth switch 180, 190 enable the video input data to be sampled once per frame cycle and then stored on a capacitor 200 in order to provide a stable bias level for the first switch 170 until the next refresh cycle.

Under normal operation the fusible element 160 presents an insignificant resistance in series with the OLED pixel 105, resulting in zero impact on the pixel driver performance. For example, an OLED pixel will draw a maximum current of several 10's of nanoamps at peak brightness. A suitable value for the fusible element 160 will be in the range of less than a few 1000 ohms. As a result, the maximum voltage drop across the fusible element 160 will be less than 1 millivolt at peak brightness.

In the case of a stuck-on OLED pixel 110 the path formed by the first switch 170, the fuse 160, and the OLED pixel 105, is in a permanent conducting state and the OLED pixel 105 cannot be turned off. It is preferable to completely deactivate this OLED pixel 105 rather than allow it to be always emitting light. In the present invention, this is resolved by blowing the fuse 160 so that the circuit formed by the first switch 170, the fuse 160, and the OLED pixel 110 is opened and the OLED pixel 110 is put in a permanently OFF state. In order to blow the fuse 160 a brief high-current pulse, preferably a few milliamps, is forced through the path formed by the first switch 170, the fuse 160, and fourth switch 220, causing the fuse 160 to melt and create an open circuit. The fourth switch 220 is normally biased near a sub-threshold region, preferably with a gate voltage of about 0.5V, and easily supports several milliamps of current to blow the fuse 160, by driving the fuse 160 briefly with the full 5V supply.

Figures 4A, 4B:
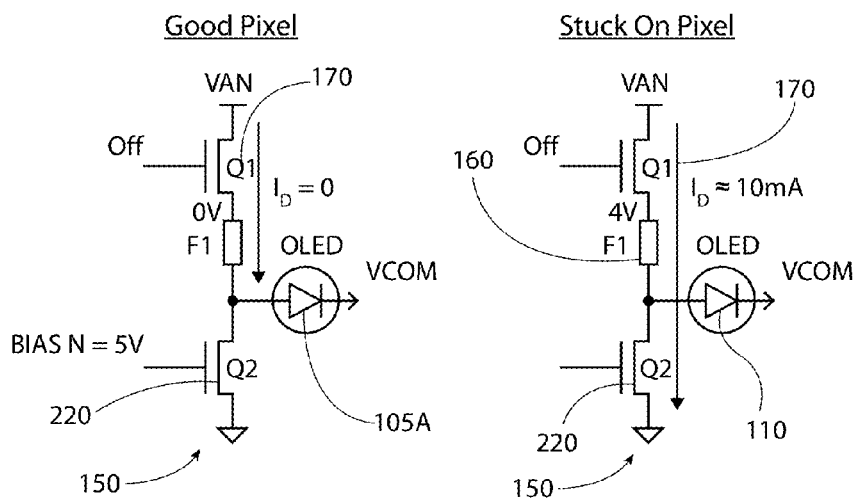
FIG. 4A is a pixel driver circuit, showing an operative OLED pixel in accordance with an exemplary embodiment.
FIG. 4B is a pixel driver circuit, showing an inoperative OLED pixel in accordance with an exemplary embodiment.

FIGS. 4A and 4B illustrates the effect of a repair method 500 on two OLED pixels, including an operative OLED pixel 105A (shown in FIG. 4A) and an inoperative or stuck-on OLED pixel 110 (shown in FIG. 4B) according to an exemplary embodiment. The method 500 includes the first switching device 170 applying a drive current to the OLED pixel 105 for modulating luminance. When the drive current applied to the OLED pixel 105 is reduced below a threshold level, the OLED pixel 105 should not emit light. All the operative OLED pixels 105A are turned off and only stuck-on or inoperative OLED pixels 110 will remain on. Then, the second switching device 220 applies a bias current (much higher than the normal operating bias current: mAs vs. nAs) to the driver circuit. In particular, the BIASN voltage is raised to its maximum value of 5V for the entire OLED array. BIASN voltage is a signal that feeds into all of the OLED pixels in parallel. As such, raising the BIASN voltage will have no effect on the operative OLED pixels 105 since the first switching device 170 is turned off in those OLED pixels. As a result, no current will flow through the fusible element 160 of the associated operative OLED pixel 105.

For each stuck-on OLED pixel 110, shown in FIG. 4B, the first switching device 170 is turned on, and as such a current will flow through the associated fusible element 160 according to the following relationship:

$$I_{F1} = (VAN - Vth)/R_{F1} \approx 10 \text{ mA}$$

For illustrative purposes, when $I_{F1}$ is raised to 5V, (VAN−Vth) is ≈4V and $R_{F1} \approx 400$ ohms. In accordance with the relationship, the fusible element 160 is able to blow open at this level of current when the inoperative OLED pixel 110 is present. All fusible elements associated with stuck-on OLED pixels 110, 112, 114 will be blown substantially simultaneously, and most specifically, within a matter of milliseconds. At which point all stuck-on OLED pixels will no longer be stuck-on and the entire display is repaired at once.

Figure 5:
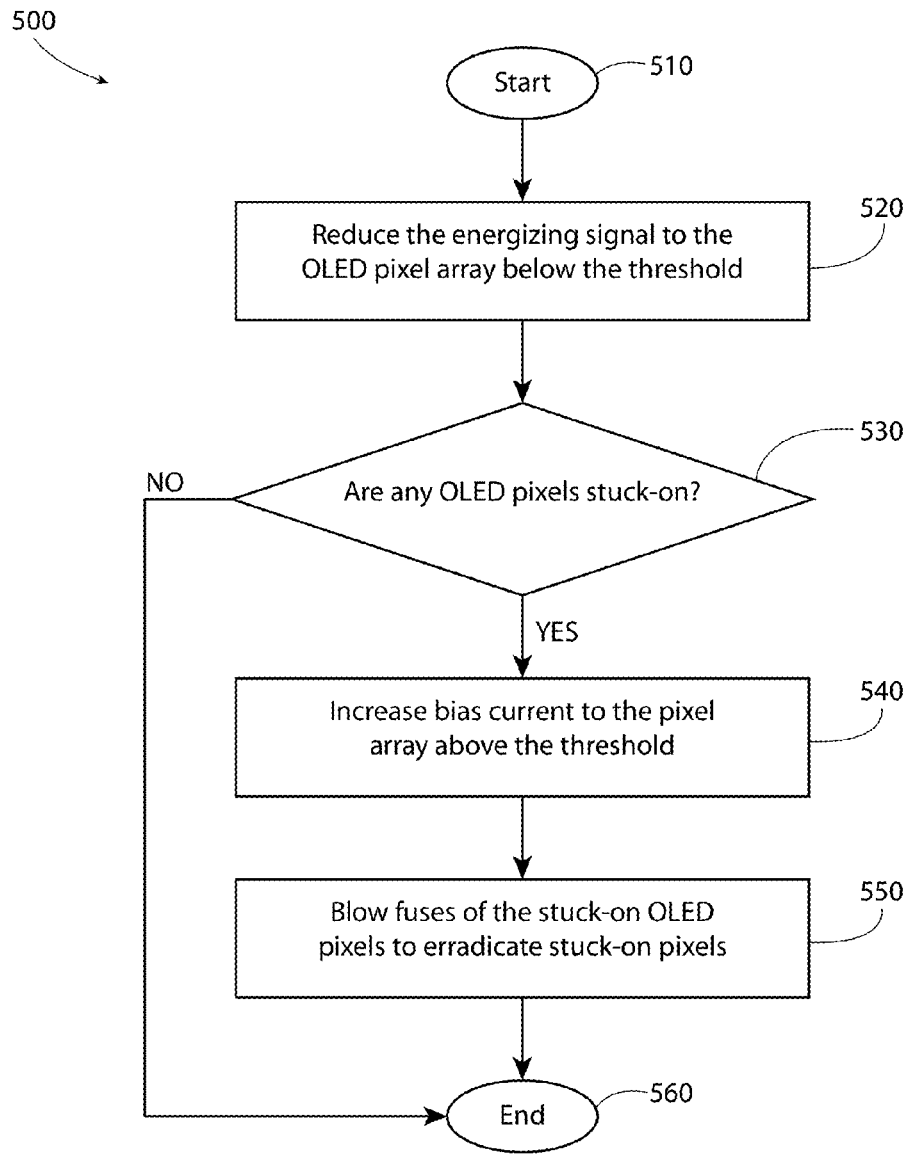
FIG. 5 is a method of repairing OLED pixel defects in accordance with an exemplary embodiment.

FIG. 5 illustrates method 500 according to an exemplary embodiment. The method 500 starts at start circle 510 and proceeds to operation 520, which indicates to reduce the energizing signal to the OLED pixels below a threshold level. From operation the flow in method 500 proceeds to decision 530, which asks whether any of the OLED pixels are stuck-on. If the answer to decision 530 is affirmative, the flow proceeds to operative 540, which indicates to increase the bias signal to the OLED pixels. The energizing signal exceeds the threshold level. From operative 540 the flow in method 500 proceeds to operative 550, which indicates that the fusible link of the stuck-on OLED pixels is blown. After the elimination of stuck-on OLED pixels, the flow proceeds to end circle 560. If the answer to decision 530 is negative, the flow proceeds to end circle 560.

Figure 6:
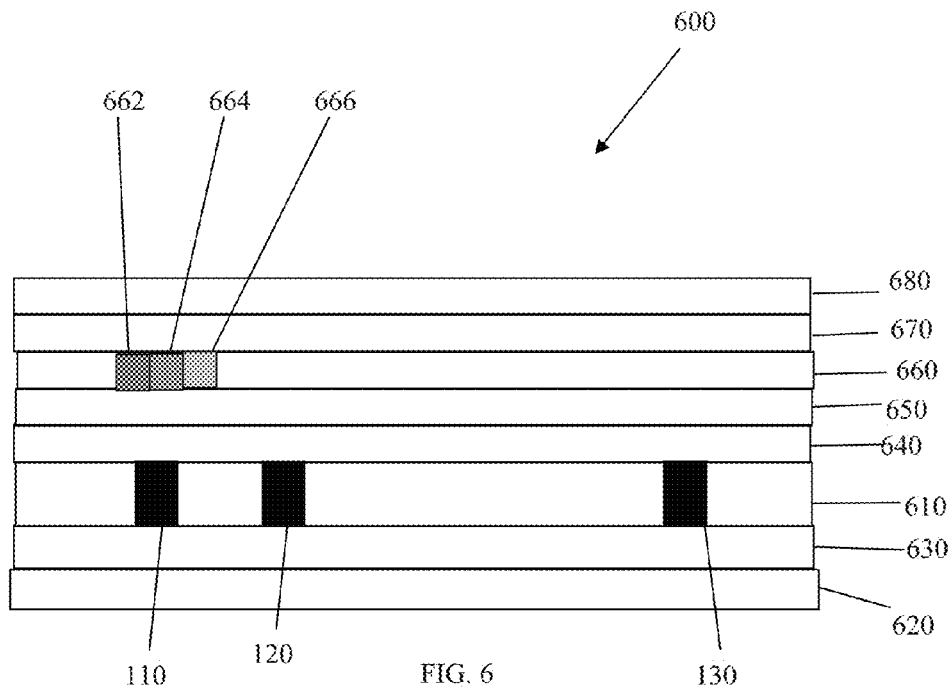
FIG. 6 is a side view of an OLED array including internal layers and sealing layers in accordance with an exemplary embodiment.

FIG. 6 is a side view of a complete OLED array 600 including a first OLED layer 610 and various other layers in accordance with an exemplary embodiment. The OLED array 600 discussed above in regard to FIGS. 1-4 may include some or all of the layers of the complete OLED array 600. The OLED layer 610 includes stuck-on OLED pixels 110, 120 and 130. A second layer 620 is arranged on the bottom of the complete OLED array 600, and may include $Al_2O_3$, which may seal the OLED, reflect light output from the first OLED layer 610 and/or operate as a cathode or anode for the first OLED layer 610. The second layer 620 may be arranged on another layer, which provides a substrate, drive circuitry and/or any other appropriate function. Specifically, the second layer contains the first and second driving switches and the fusible link. Preferably, the fusible link is formed of polysilicon or a metal contained in the integrated circuit process. A third layer 630 arranged above the second layer 620 and directly below the first OLED layer 610 may include parylene, which may provide the function of sealing the first OLED layer 610. A fourth layer 640 is arranged above the first OLED layer 610 may include parylene, which may be deposited in a thin film by vapor deposition, and may provide the function of sealing the first OLED layer 610. The fourth layer 640 may be UV sensitive, and in particular may be sensitive to UV light of less than 365 nm wavelength. A fifth layer 650 arranged above the fourth layer 640 may include $SiO_2$, which may be deposited by any appropriate method. A fifth layer 650 may provide a transparent cathode or anode for controlling the first OLED layer 610.

A sixth layer 660 arranged above the fifth layer 650 may be a color filter, which may include filter sections 662, 664 and 666. The filter sections 662, 664 and 666 are shown in only a small section of the fifth layer 650, but may fill the entire width of the sixth layer 660. The filter sections 662, 664 and 666 may correspond to red, blue and green filters, in no particular order other than forming a regular pattern within the sixth layer 660. Each filter section may correspond to a particular OLED, so that energizing the particular OLED causes light to be filtered through the particular filter section. The sixth layer 660 may be deposited by any appropriate method. Alternatively, the sixth layer 660 may not be included in the layers of the complete OLED array 600 if the OLED array is used to only emit a single color of light, or if different OLED pixels that emit different colors of light are included in the OLED layer 610.

A seventh layer 670 arranged above the sixth layer 660 may include glue or another adhesive for attaching a glass or other final sealing material. The seventh layer 670 may be deposited by any appropriate method. An eighth layer 680 arranged above the seventh layer 670 may include glass, which may be attached mechanically to the glue of the seventh layer 670 while the glue is tacky. The eighth layer 680 may provide the function of sealing the OLED array in order to prevent contamination of the OLED pixels in the first OLED layer 610, as well as preventing the degradation of any other components.

After blowing the fusible element of the stuck-on pixel, the method of manufacturing the OLED array may include applying a surface layer to the array of OLED pixels. Any of the layers shown in FIG. 6 that are not present at the time of repairing stuck-on OLED pixels may be applied after that process to form the complete OLED array 600. The layers in the complete OLED array 600 may be deposited or arranged in any appropriate manner, including vacuum deposition, thermal evaporation, printing, and/or spin coating.

Figure 7:
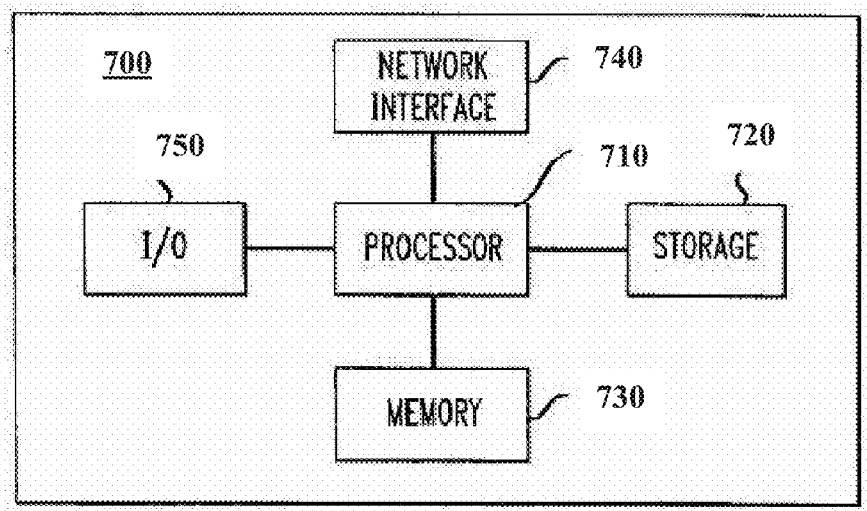
FIG. 7 illustrates a computer system according to an exemplary embodiment.

FIG. 7 illustrates a computer system according to an exemplary embodiment. The computer 700 can, for example, operate the driver circuit 140 to programmably repair the stuck-on OLED pixel defects at a predetermined time. Additionally, the computer 700 can perform the steps described above (e.g., with respect to FIG. 5). The computer 700 contains a processor 710 which controls the operation of the computer 700 by executing computer program instructions which define such operation, and which may be stored on a computer-readable recording medium. The computer program instructions may be stored in storage 720 (e.g., a magnetic disk, a database) and loaded into a memory 730 when execution of the computer program instructions is desired. Thus, the computer operation will be defined by the computer program instructions stored in the memory 730 and/or storage 720 and the computer 700 will be controlled by the processor 710 executing the computer program instructions. The computer 700 also includes one or more network interfaces 740 for communicating with other devices, for example other computers, servers, or websites. The network interface 740 may, for example, be a local network, a wireless network, an intranet, or the Internet. The computer 700 also includes input/output 750, which represents devices which allow for user interaction with the computer 700 (e.g., display, keyboard, mouse, speakers, buttons, webcams, etc.). One skilled in the art will recognize that an implementation of an actual computer will contain other components as well, and that FIG. 7 is a high level representation of some of the components of such a computer for illustrative purposes.

In conclusion, herein is presented a system and method for electrically repairing stuck-on OLED pixels within an electronic display. The invention is illustrated by example in the drawing figures, and throughout the written description.

It should be understood that numerous variations are possible, while adhering to the inventive concept. Such variations are contemplated as being a part of the present invention.

While only a limited number of preferred embodiments of the present invention have been disclosed for purposes of illustration, it is obvious that many modifications and variations could be made thereto. It is intended to cover all of those modifications and variations, which fall within the scope of the present invention as defined by the following claims.

I claim:

1. A driver circuit for an OLED pixel, the OLED pixel having an operative state and an inoperative state, comprising:
    a first switching device applying a drive current to the OLED pixel configured to modulate luminance, wherein the drive current to the OLED pixel is reduced below a threshold level below which the OLED pixel should not emit light;
    a second switching device applying a bias signal to the OLED pixel; and
    means for interrupting current between the drive current and the OLED pixel, the means for interrupting current disposed in a circuit defined between the first switching device and the second switching device.

2. The pixel driver circuit of claim 1 wherein means for interrupting current is a fusible element.

3. The circuit of claim 2 wherein the drive current to the OLED pixel is reduced below the threshold level below which the first switching device is turned off and the OLED pixel in the operative state will not emit light.

4. The circuit of claim 2 wherein no current will flow through the fusible element when the fusible element is blown.

5. The circuit of claim 2 wherein the drive current to the OLED pixel is reduced below the threshold level below which the first switching device remains stuck-on and the OLED pixel in the inoperative state emits light.

6. The circuit of claim 5 wherein the bias signal applied to the OLED pixel in the inoperative state exceeds the threshold level above which the fusible element is blown.

7. The circuit of claim 6 wherein the fusible element blows open at a current level of 10 mA or greater.

8. The circuit of claim 2 wherein the fusible element comprises low-resistance polysilicon.

9. The circuit of claim 2 wherein the fusible element comprises metal.

10. A method for manufacturing an organic light emitting diode (OLED) array comprising OLED pixels, including at least one stuck-on OLED pixel, comprising:
at least partially forming the OLED array, each OLED pixel in the OLED array including a fusible element and being responsive to an energizing signal exceeding a threshold level to energize the OLED pixel;
applying the energizing signal to at least one of the OLED pixels, the energizing signal exceeding the threshold level;
applying a bias signal to the OLED array to linearize a response of a switch applying the energizing signal to the at least one of the OLED pixels;
reducing the energizing signal applied to the at least one of the OLED pixels below the threshold level, wherein the at least one stuck-on OLED pixel continues to remain energized after the energizing signal is reduced below the threshold level; and
increasing the bias signal to the OLED array, the bias signal exceeding the threshold level above which the fusible element of the at least one stuck-on OLED pixel is blown and the at least one stuck-on OLED pixel no longer emits light.

11. A method for repairing stuck-on OLED pixels within an OLED array manufacturing process, the OLED array comprising OLED pixels including at least one operative OLED pixel and at least one inoperative OLED pixel, wherein each OLED pixel is controlled by a driver circuit and has a fusible element, the method comprising:
applying an energizing signal to the OLED array, the energizing signal exceeding a threshold level to energize the OLED array;
applying a bias signal to the OLED array to linearize a response of a switch applying the energizing signal to the at least one OLED pixel of the OLED display;
driving the at least one operative OLED pixel within the OLED array to black by reducing the energizing signal to the OLED array below the threshold level; and
blowing the fusible element of the at least one inoperative OLED pixel by increasing the bias signal to the OLED array above the threshold level.

12. The method of claim 11 wherein the bias signal is increased to at least 5 Volts.

13. A system for repairing stuck-on OLED pixels in an OLED array manufacturing process, the OLED array comprising OLED pixels including at least one stuck-on OLED pixel, wherein each OLED pixel is controlled by a driver circuit and has a fusible element, the system comprising:
means for applying an energizing signal to the OLED array, wherein the energizing signal exceeding a threshold level below which the OLED pixels should not emit light;
means for applying a bias signal to the OLED array to linearize a response of a switch applying the energizing signal to the OLED pixels of the OLED array;
means for reducing the energizing signal applied to the OLED array below the threshold level, wherein the at least one stuck-on OLED pixel continues to remain energized after the energizing signal is reduced below the threshold level; and
means for increasing the bias signal to the OLED array, the bias signal exceeding the threshold level above which the fusible element of the at least one stuck-on OLED pixel is blown, such that the at least one stuck-on OLED pixel no longer emits light.

14. A computer-readable medium having stored thereon computer-executable instructions, the computer-executable instructions causing a processor to perform a method when executed, the method for repairing stuck-on OLED pixels within an OLED array manufacturing process, the OLED array comprising OLED pixels including at least one operative OLED pixel and at least one inoperative OLED pixel, wherein each OLED pixel is controlled by a driver circuit and has a fusible element, the method comprising:
applying an energizing signal to the OLED array, the energizing signal exceeding a threshold level to energize the OLED array;
applying a bias signal to the OLED array to linearize a response of a switch applying the energizing signal to the OLED pixels of the OLED array;
driving the at least one operative OLED pixel within the OLED array to black by reducing the energizing signal to the OLED array below the threshold level; and
blowing the fusible element of the at least one inoperative OLED pixel by increasing the bias signal to the OLED array above the threshold level.

* * * * *